United States Patent
Ren et al.

(10) Patent No.: US 10,243,595 B2
(45) Date of Patent: Mar. 26, 2019

(54) DETECTION METHOD AND DEVICE FOR DIGITAL INTERMEDIATE FREQUENCY PROCESSING SYSTEM, AND COMPUTER STORAGE MEDIUM

(71) Applicant: SANECHIPS TECHNOLOGY CO., LTD., Shenzhen, Guangdong (CN)

(72) Inventors: Xiuhong Ren, Shenzhen (CN); Boyuan Fan, Shenzhen (CN)

(73) Assignee: Sanechips Technology Co. Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/742,698

(22) PCT Filed: Jul. 1, 2016

(86) PCT No.: PCT/CN2016/088153
§ 371 (c)(1),
(2) Date: Jan. 15, 2018

(87) PCT Pub. No.: WO2017/005144
PCT Pub. Date: Jan. 12, 2017

(65) Prior Publication Data
US 2018/0191385 A1     Jul. 5, 2018

(30) Foreign Application Priority Data
Jul. 9, 2015   (CN) .......................... 2015 1 0401678

(51) Int. Cl.
*H04B 1/04* (2006.01)
*H04B 17/391* (2015.01)
(Continued)

(52) U.S. Cl.
CPC ......... *H04B 1/0475* (2013.01); *H04B 17/391* (2015.01); *H04L 25/03159* (2013.01);
(Continued)

(58) Field of Classification Search
CPC .... H04B 1/0475; H04B 17/00; H04B 17/391; H04L 25/03159; H04L 27/2624; H04L 25/03; G01R 23/14
(Continued)

(56) References Cited

U.S. PATENT DOCUMENTS

| 2004/0193982 A1* | 9/2004 | Bhora et al. ......... H04B 1/0475 455/114.3 |
| 2012/0108188 A1 | 5/2012 | Matsumoto |
| 2012/0321018 A1* | 12/2012 | Chen ................... H03F 1/3247 375/296 |

FOREIGN PATENT DOCUMENTS

| CN | 1928576 A | 3/2007 |
| CN | 101203017 A | 6/2008 |

(Continued)

OTHER PUBLICATIONS

International Search Report in international application No. PCT/CN2016/088153, dated Sep. 23, 2016, 2 pgs.
(Continued)

*Primary Examiner* — Tan H Trinh
(74) *Attorney, Agent, or Firm* — Cooper Legal Group, LLC

(57) ABSTRACT

Disclosed are a detection method and device for a digital intermediate frequency processing system. The method comprises: forming and transmitting excitation data to a digital intermediate frequency processing system; collecting detection data formed by processing the excitation data by the digital intermediate frequency processing system; and performing a bit-by-bit comparison on the detection data and reference data to form a detection result. Further provided is a computer storage medium.

7 Claims, 3 Drawing Sheets

(51) Int. Cl.
*H04L 25/03* (2006.01)
*H04L 27/26* (2006.01)
*G01R 23/14* (2006.01)

(52) U.S. Cl.
CPC .......... *H04L 27/2624* (2013.01); *G01R 23/14* (2013.01); *H04L 25/03* (2013.01)

(58) Field of Classification Search
USPC ............. 455/114.3, 15, 414.4, 63.1; 375/296
See application file for complete search history.

(56) References Cited

FOREIGN PATENT DOCUMENTS

| | | |
|---|---|---|
| CN | 101227693 A | 7/2008 |
| CN | 101557598 A | 10/2009 |
| CN | 101640898 A | 2/2010 |
| CN | 101813783 A | 8/2010 |
| CN | 201766716 U | 3/2011 |
| CN | 102833012 A | 12/2012 |
| CN | 102857958 A | 1/2013 |
| CN | 103200587 A | 7/2013 |
| CN | 103227683 A | 7/2013 |
| CN | 103458432 A | 12/2013 |
| JP | H1133125 A | 2/1999 |
| WO | 2011020438 A1 | 2/2011 |
| WO | 2012054759 A1 | 4/2012 |

OTHER PUBLICATIONS

English Translation of the Written Opinion of the International Search Authority in international application No. PCT/CN2016/088153, dated Sep. 23, 2016, 5 pgs.

Supplementary European Search Report in European application No. 16820795.9, dated Jun. 5, 2018, 8 pgs.

* cited by examiner

DETECTION METHOD AND DEVICE FOR DIGITAL INTERMEDIATE FREQUENCY PROCESSING SYSTEM, AND COMPUTER STORAGE MEDIUM

TECHNICAL FIELD

The disclosure relates to the field of communications, and in particular to a method and apparatus for detecting a Digital Intermediate Frequency (DIF) processing system, and a computer storage medium.

BACKGROUND

In a radio communication system, a Remote Radio Unit (RRU) is a bridge connecting a Base Band Unit (BBU) and a radio frequency unit. A DIF processing system in the RRU may perform DIF processing on a signal transmitted by the RRU. In order to reduce interference to a baseband signal generated by the BBU and a radio frequency signal formed by the radio frequency unit, the correctness and stability of the DIF processing system are highly required. Otherwise, the problems of poor communication quality and the like will be caused. In such a way, during detection of the processing accuracy and stability of the DIF processing system, bit-level detection is preferably performed.

However, DIF processing of the DIF processing system is performed according to a data stream instead of a data packet. The data stream fails to involve a packet header and a packet tail. Since a feedback ring is present during the DIF processing of the data stream, each data bit in the data stream will influence a subsequent processing result. Based on this, it is very difficult to perform bit-level correctness comparison by capturing a segment from the output data stream.

Due to large difficulty in bit-level detection, an existing detection method refers to overall detection on the whole RRU transmission data. This detection method has the following problems.

Problem One

Detection is indirect detection on the DIF processing system via overall detection on RRU transmission data, rather than direct detection on the DIF processing system. Obviously, a detection result is not accurate.

Problem Two

When a detection result shows a problem, it is not able to be accurately determined whether the problem comes from the DIF processing system.

Problem Three

During detection, it is necessary to set up a detection environment. When the detection environment is set up, instruments such as a BBU, a spectrometer and a signal source are needed. Apparently, the cost of a detection device is high, setup of the detection environment wastes time and energy, and the detection efficiency is low. Particularly, every time a communication mode is detected for a system supporting various communication modes, it is necessary to re-set up an environment.

SUMMARY

In view of this, the embodiments of the disclosure are intended to provide a method and apparatus for detecting a DIF processing system, which are be able to solve at least one of low detection result accuracy, fault non-locating, high detection cost and low detection efficiency.

The technical solutions of the disclosure are implemented as follows.

The embodiments of the disclosure provide a method for detecting a DIF processing system. The method includes the steps as follows. Excitation data is formed. The excitation data is sent to the DIF processing system. Detection data formed by the DIF processing system processing the excitation data is collected. The detection data is compared with reference data bit by bit to form a detection result.

Based on the above-mentioned solution, the step that the excitation data is sent to the DIF processing system includes the sub-step as follows. The excitation data is sent to a downlink of the DIF processing system. The detection data includes: a downlink detection signal formed by sequentially performing Digital Up Converter (DUC) processing, Crest Factor Reduction (CFR) processing and Digital Pre-Distortion (DPD) processing on the excitation data via the downlink.

Based on the above-mentioned solutions, the step that the excitation data is sent to the DIF processing system includes the sub-step as follows. The excitation data is sent to an uplink of the DIF processing system. The detection data includes: an uplink detection signal formed by performing Digital Down Converter (DDC) processing on the excitation data via the uplink.

Based on the above-mentioned solutions, the method may further include the steps as follows. A detection parameter is configured. The detection parameter includes an algorithm parameter and the algorithm parameter is consistent with an algorithm parameter forming the reference data.

Herein, the detection parameter is a configuration parameter for the DIF processing system to process the excitation data.

Based on the above-mentioned solutions, the excitation data is a periodic sequence sent periodically.

According to a second aspect of the embodiments of the disclosure, an apparatus for detecting a DIF processing system is also provided. The apparatus includes an excitation data forming unit, configured to form excitation data; a sending unit, configured to send the excitation data to the DIF processing system; a collection unit, configured to collect detection data formed by via the DIF processing system processing the excitation data; and a comparison unit, configured to compare the detection data with reference data bit by bit to form a detection result.

Based on the above-mentioned solutions, the sending unit is configured to send the excitation data to a downlink of the DIF processing system. The detection data includes: a downlink detection signal formed by sequentially performing DUC processing, CFR processing and DPD processing on the excitation data via the downlink.

Based on the above-mentioned solutions, the sending unit is configured to send the excitation data to an uplink of the DIF processing system. The detection data includes: an uplink detection signal formed by performing DDC processing on the excitation data via the uplink.

Based on the above-mentioned solutions, the apparatus may further include a configuration unit, configured to configure a detection parameter. The detection parameter includes an algorithm parameter and the algorithm parameter is consistent with an algorithm parameter forming the reference data.

Herein, the detection parameter is a configuration parameter for the DIF processing system to process the excitation data.

Based on the above-mentioned solutions, the excitation data is a periodic sequence sent periodically.

According to a third aspect of the embodiments of the disclosure, a computer storage medium is also provided. The computer storage medium stores computer-executable instructions. The computer-executable instructions are used to execute the foregoing method for detecting a DIF processing system.

According to the method and apparatus for detecting a DIF processing system in the embodiments of the disclosure, excitation data is sent to the DIF processing system, detection data output via the DIF processing system is collected, and the detection data is compared with reference data to obtain a detection result. In the application, the detection data is data directly output by the DIF processing system. Accordingly, compared with data processed by other results in the related art, the detection data can more accurately represent the processing accuracy of the DIF processing system, and can accurately reflect the processing performance of the DIF processing system. Meanwhile, the detection result formed according to the detection data of the present disclosure can accurately reflect whether the DIF processing system is faulty. The problem in the related art in which a fault cannot be located due to data processing via a result rather than the result of a DIF processing system will not be caused. In addition, the detection method and apparatus of the present disclosure may utilize existing structures such as a Central Processing Unit (CPU) and a transmission link in an RRU without introduction of structures such as a spectrometer and a signal source, thereby reducing the hardware cost of detection. Moreover, it is unnecessary to set up different transmission links according to different communication modes, thereby increasing the detection efficiency.

DETAILED DESCRIPTION

The technical solutions of the disclosure will be further elaborated below in conjunction with the drawings of the description and specific embodiments. It will be appreciated that preferred embodiments described below are only used to describe and explain the disclosure, and not used to limit the disclosure.

Figure 1:
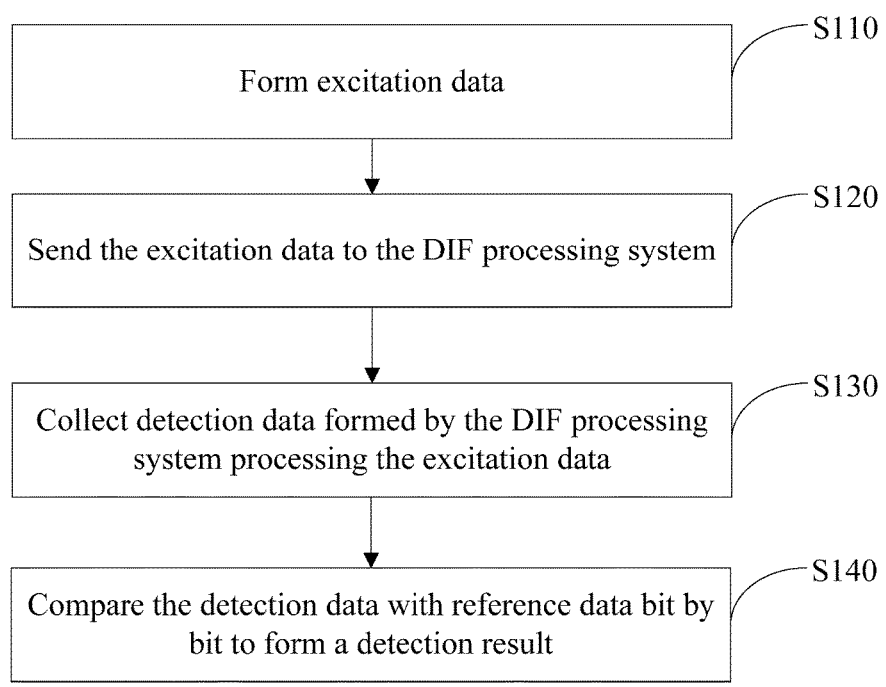
FIG. 1 is a flow diagram of a method for detecting a DIF processing system according to an embodiment of the disclosure.

As shown in FIG. 1, the present embodiment provides a method for detecting a DIF processing system. The method includes the steps as follows.

In step S110, excitation data is formed.

In step S120, the excitation data is sent to the DIF processing system.

In step S130, detection data formed by the DIF processing system processing the excitation data is collected.

In step S140, the detection data is compared with reference data bit by bit to form a detection result.

The excitation data may be data dedicated to detection of the DIF processing system. The excitation data may be a data sequence with known data contents in advance and the like.

In step S120, the excitation data is sent to the DIF processing system for processing by the DIF processing system.

In step S130, detection data formed by the DIF processing system processing the excitation data is collected.

In step S140, the reference data is a correct result subject to intermediate frequency processing obtained in a pre-simulation manner and formed based on the excitation data. Therefore, the reference data is a correct result of intermediate frequency processing. By means of a bit-by-bit comparison with the detection data, the processing accuracy of the detected DIF processing system can be determined apparently.

According to the method for detecting a DIF processing system in the present embodiment, compared with detection on the whole RRU, direct detection on a processing result (namely the detection data) of the detected DIF processing system will not influence a detection result by structures such as a processing structure in the RRU and a BBU, thereby increasing the accuracy of detection on the DIF processing system. During a detection process, by sending excitation data dedicated to detection, the content of the excitation data can be known in advance, and the excitation data is compared with reference data formed based on the excitation data bit by bit, so as to implement bit-level detection on the DIF processing system and to ensure the accuracy of the detection result again. The processing result of the DIF processing system is directly detected, if it is considered that the accuracy of the detection result is too low, it may be directly determined whether the DIF processing system is faulty, thereby solving the problem in the related art in which a fault point cannot be located. Moreover, in the present embodiment, it is unnecessary to specially set up a detection environment, and an existing structure in an RRU can be directly used for detection, thereby reducing the hardware cost, and increasing the detection efficiency.

The DIF processing system may include an uplink and a downlink. Uplink detection and downlink detection will be introduced in detail below respectively.

The downlink detection is as follows.

Step S120 may include: sending the excitation data to the downlink of the DIF processing system.

The detection data includes: a downlink detection signal formed by sequentially performing DUC processing, CFR processing and DPD processing on the excitation data via the downlink.

Figure 2:
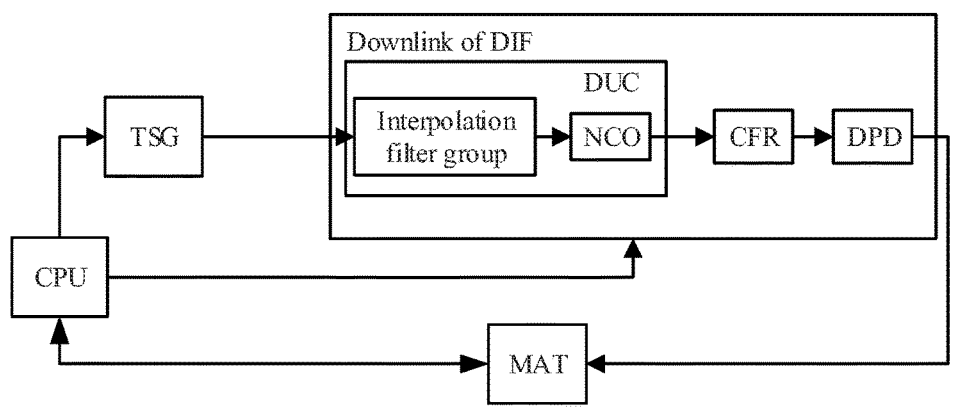
FIG. 2 is a flow diagram of a downlink signal of a DIF processing system according to an embodiment of the disclosure.

As shown in FIG. 2, the downlink of the DIF processing system may include: a DUC module, a CFR module and a DPD processing module. The DUC module can perform DUC processing, the CFR module is used to perform CFR processing, and the DPD processing module is used to perform DPD processing. The DUC module includes an interpolation filter group and a Numerically Controlled Oscillator (NCO). The DUC processing includes interpolation filtering of the interpolation filter group and digital mixing of the NCO.

In step S110, the excitation data may be formed by a CPU in FIG. 2, and sent to the downlink of the DIF processing system via a Test Signal Generator (TSG) unit. In step S130, data output by the downlink of the DIF processing system is collected by means of a Maintain And Test (MAT) unit, so as to obtain the detection data. The detection data is returned to the CPU and compared with reference data. During specific implementation, the CPU may be replaced with any processor or processing circuit. The processor may include a structure having information processing and control, such as an Application Processor (AP), a Micro Control Unit (MCU), a Digital Signal Processor (DSP), a Programmable Logic Controller (PLC) or the like. The processing circuit may include a structure such as an Application Specific Integrated Circuit (ASIC).

The uplink detection is as follows.

Step S120 may include sending the excitation data to the uplink of the DIF processing system. The detection data includes an uplink detection signal formed by performing DDC processing on the excitation data via the uplink.

Figure 3:
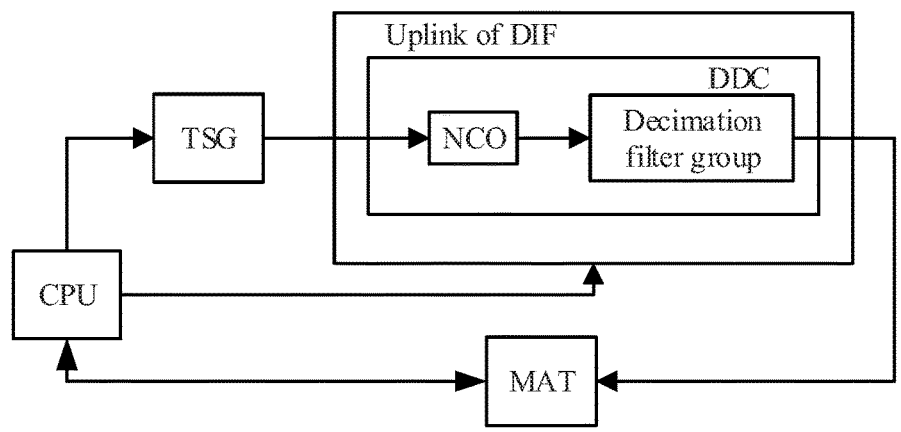
FIG. 3 is a flow diagram of an uplink signal of a DIF processing system according to an embodiment of the disclosure.

As shown in FIG. 3, the uplink of the DIF processing system may include a DDC unit. The DDC unit includes an NCO and a decimation filter group. The DDC unit can be used to perform DDC processing on the excitation data. The DDC processing includes digital mixing via the NCO and decimation filtering performed by the decimation filter group.

Accordingly, in the present embodiment, the detection data may include an uplink detection signal formed by performing DIF processing via the uplink of the DIF processing system.

Devices such as the TSG unit, the CPU and the MAT in FIG. 2 and FIG. 3 may be existing structures in the RRU, and the bit-level detection on the DIF processing system is achieved by reusing these structures. Therefore, the characteristic of low hardware cost is provided, and it is unnecessary to specially set up a corresponding detection environment.

Figure 4:
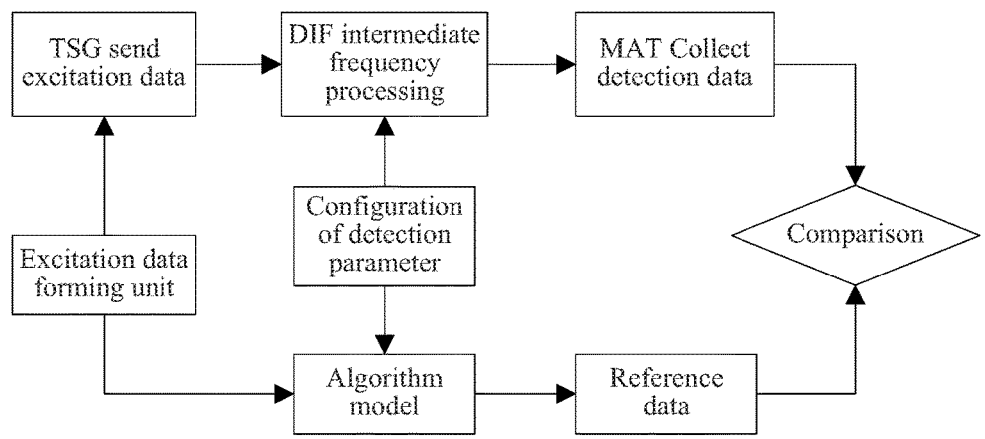
FIG. 4 is a flow diagram of another method for detecting a DIF processing system according to an embodiment of the disclosure.

As shown in FIG. 4, the method further includes the steps as follows.

A detection parameter is configured. Herein the detection parameter includes an algorithm parameter, the algorithm parameter being consistent with an algorithm parameter forming the reference data.

Herein, the detection parameter is a configuration parameter for the DIF processing system to process the excitation data.

Before detection, the method in the present embodiment further includes: configuring a detection parameter. In order to facilitate comparison to ensure the accuracy of a detection result, a processing parameter of DIF processing for forming reference data should keep consistent with a detection parameter of the detected DIF processing system. An algorithm parameter of the detected DIF processing system for DIF processing should be, at least, consistent with an algorithm parameter for forming the reference data. Accordingly, the detection parameter is pre-configured in the present embodiment, and the algorithm parameter in the detection parameter is consistent with the algorithm parameter of the reference data.

Certainly, the detection parameter may further include other parameters such as a collection period, a collection frequency and a processing frequency. These parameters may be configured with reference to the related art, and will not be illustrated herein.

As a further improvement of the present embodiment, the excitation data is a periodic sequence sent periodically. Specifically, the excitation data is a 32 bit periodic sequence sent periodically. In such a way, the periodic sequence is utilized for detection, so that during discrete repeated detection or successive repeated detection, it is unnecessary to form the reference signal in other forms such as simulation at each time. Thus, forming of reference data can be simplified, thereby simplifying the operation.

Certainly, in a specific implementation process, the excitation data may also be a non-periodic sequence which is randomly formed. The reference data is formed by simulation processing on each excitation data. As such, the DIF processing system can be also detected.

As shown in FIG. 4, a detection parameter is formed according to an algorithm parameter of an algorithm model, and the DIF processing system is configured with the detection parameter. An excitation data forming unit sends the excitation data to the algorithm model and a TSG unit respectively, and the TSG unit sends the excitation data to the DFI processing system. The DFI processing system performs DFI processing, and the algorithm model performs simulation processing and the like. The algorithm model outputs reference data, the MAT unit collects detection data, and the detection data and the reference data are compared to form the detection result in the embodiment of the present application. Apparently, the detection data in the embodiment of the present application is data output by the DFI processing system directly.

Each processing structure in the DFI processing system is involved in FIG. 2 and FIG. 3. Various types of DFI processing performed on the above-mentioned structure are relevantly introduced as follows.

The interpolation filter group is mainly used to perform interpolation and convolution operation. As for interpolation filtering, if periodic check data is output, an output result is periodic after N-time interpolation, and a cycle period is N times a period inputting check data. As for convolution operation, although data input at a current time influences output of data at the following K (the value of K is equal to the length of a filter coefficient) times, the periodicity of the output result cannot be influenced. That is, if the period inputting check data is M, the output data is a sequence of which the period is N*M after the interpolation filter group performs N-times interpolation. Accordingly, the output result of the interpolation filter group can be determined by selecting periodic excitation data and an interpolation multiple.

During digital mixing of the NCO, a sine-cosine digital signal is generated, and then the sine-cosine signal is multiplied by a signal to be mixed, so as to complete a function of transferring the signal to be mixed over a spectrum of a frequency domain. Because the sine-cosine signal is equivalent to a spectrum pulse in the frequency domain, multiplying of signals in a time domain is equivalent to convolution processing in the frequency domain. A convolution result of a pulse signal and other signals is that the pulse signal completes a process of completely transferring other signals to a pulse point. A mathematical model corresponding to the NCO may be as shown in function relations (1) to (3):

$$y(n) = x(n) * e^{jw_c n} \quad \text{function relation (1)}$$
$$= (I(n) + Q(n) * j) * e^{jw_c n}$$
$$= [(I(n) * \cos(w_c n) - Q(n) * \sin(w_c n)] +$$
$$j[(Q(n) * \cos(w_c n) - I(n) * \sin(w_c n)]$$

$$S(n) = \cos\left(2\pi \cdot \frac{f_{LO}}{f_s} \cdot n\right) \quad \text{function relation (2)}$$

$$x(n) = I(n) + Q(n) * j \quad \text{function relation (3)}$$

where $f_{LO}$ is a local oscillation frequency, and $f_s$ is a sampling frequency of a corresponding signal.

By analyzing the periodicity of a trigonometric function, it can be seen that $\cos(w_c n)$ and $\sin(w_c n)$ in the function relations (1) and (3) have the same period N, where N is a denominator of a simplest fraction $$\frac{f_{LO}}{f_s}.$$

x(n)| in the function relation (1) is a sequence of which the period is M. If the period of y(n) in the function relations (1) and (3) is P, P is a lowest common multiple of N and M. By selecting a cycle period of excitation data x(n)| and controlling $f_{LO}$, the NCO can be controlled to output data. That is, in a successive data stream, if any one collected successive data vector (length is L) is a subset of reference data vectors (length is W), it is considered that detection is passed. Herein, a data vector to be selected is required to satisfy W≥(L+P−1).

The CFR processing in the present embodiment can utilize hard CFR or pulse offset CFR.

Hard CFR is implemented by judging signal instantaneous power. When the signal power is smaller than or equal to a predetermined CFR threshold, a signal is not processed, and when the signal power is greater than the threshold, the signal amplitude is equal to the threshold. A mathematical principle model is as shown in:

$$y(n) = \begin{cases} x(n), & |x(n)| \leq A \\ A, & |x(n)| > A \end{cases} \quad \text{function relation (4)}$$

where y(n) in the function relation (4) is a hard CFR output sequence, x(n) in the function relation (4) is a hard CFR input sequence, and A is a CFR threshold. By means of the above-mentioned algorithm description, it can be seen that mutual conversion between a rectangular coordinate system and a polar coordinate system is required to be performed on signals to implement the hard CFR. No matter which mathematical operation is involved in this conversion, the mathematical operation is an independent operation on single-point data. Therefore, if a sequence of which the period is M is output, an output sequence is still the sequence of which the period is M after mutual conversion between the rectangular coordinate system and the polar coordinate system. From a hard CFR mathematical model, it can be seen that a mathematical operation involved in the hard CFR is a subtraction operation on a single point, that is, a current input data point does not influence a subsequent output result. Therefore, selected excitation data x(n) is a sequence of which the period is M, and a cycle period of an output signal y(n) thereof is also M after the hard CFR. Accordingly, after the input periodic excitation data x(n) is selected, an output result of the hard CFR can be determined.

A pulse offset CFR algorithm is based on a principle of a linear system and based on an idea of signal superposition. That is, a signal envelope opposite to the processed signal is generated, and superposed with an original signal. The pulse offset CFR algorithm may be expressed by a function relation (5):

$$y(n)=x(n)-c(n) \quad \text{function relation (5)}$$

where y(n) is an offset pulse CFR output sequence, x(n) is an offset pulse CFR input sequence, and c(n) is a pulse offset sequence generated according to x(n). From the formula, it can be seen that a negative feedback ring is present in an offset pulse CFR module, thereby making it difficult to perform data comparison detection. However, x(n) in the function relation (5) in the present application comes from data of excitation data of a periodic sequence, a period being set as M; and c(n) is also a periodic sequence, a corresponding period being set as N. If y(n) is a sequence of which has the period L, L is a lowest common multiple of M and N.

Generation of c(n) in the function relation (5) via different offset CFR algorithms may be slightly different. However, by researching several offset CFR algorithms, operations contained in generation of c(n) are crest value search, digital mixing, interpolation, decimation and filtering. Digital mixing, interpolation, decimation and filtering have been analyzed above, and a periodic input sequence also results in a periodic output sequence. Crest value search is mainly analyzed below.

Crest value search may adopt three-point crest search or four-point crest search. The crest value search is analyzed with four-point crest search as an example. Other crest search manners may be slightly different from four-point crest search. However, contained basic operations are the same from the perspective of mathematical processing.

During the four-point crest search, a module value is solved by converting an input sequence from a rectangular coordinate system to a polar coordinate system, which has been analyzed above. If an input signal is a periodic sequence, an output signal thereof may keep the original periodicity, and is still a periodic sequence. After the module value of the input sequence is obtained, the module value is compared with a CFR threshold. If the module value is greater than the CFR threshold, a difference value obtained by subtracting the CFR threshold from the module value is adopted, and otherwise, 0 is adopted. A main operation on an input sequence in this process is a subtraction operation, and does not influence the periodicity thereof. Finally, the four-point crest search is performed. The basic principle is as follows. It is supposed that four successive sampling points of the processed module value are A, B, C and D. When B>A and C>=D, a larger value between B and C is a crest value, the value of a crest value point keeps unchanged, and the value of a non-crest value point is set as 0. It may be considered that the input sequence operation is a subtraction operation. A value subtracted from a crest value point is 0, and a value subtracted from a non-crest value point is itself. Accordingly, if the period of the input sequence for the four-point crest search is M, the period of a sequence output after the four-point crest search is also M.

After the four-point crest search, secondary crest search may be performed. The secondary crest search usually adopts a sliding window crest search method. The secondary crest search includes: saving a current crest value, starting to count from the location of the crest value, and waiting for a next crest value; if the coming time of the next crest value has exceeded the length of a window, reserving the saved crest value, and starting to recount from the new crest value; and if the coming time of the next crest value does not exceed the length of the window, saving a larger one between the two crest values, and continuing search; if the latter is larger, restarting to count by a counter. From the whole process of sliding window crest search, it can be seen that the sliding window crest search is similar to the four-point crest search, and a mathematical operation for an input sequence thereof may come down to a subtraction operation.

Accordingly, if the period of the input sequence is M, the period of an output sequence is also M after the sliding window crest search.

To sum up, if an excitation data sequence x(n) of which the period of M is adopted, a generated offset pulse c(n) is also a periodic sequence. Accordingly, in a successive data stream output by offset pulse CFR, if any one collected successive detection data is a subset of reference data, it is considered that detection is passed. When the detection data is compared with the reference data, the detection data and the reference data are regarded as vectors. During bit-by-bit matching and comparison, it is required to ensure that data at corresponding locations are identical. As such, it is considered that a detection result corresponding to successful bit matching is correct.

The DPD processing may adopt a memory polynomial model structure. If the number of lookup tables is N, a mathematical model of the DPD may be expressed by a function relation (6).

$$Y_{DPD}(n) = \sum_{i=1}^{N} f_i(|X(n-h_i)| * |X(n-k_i)|) \quad \text{function relation (6)}$$

where $f_i(x)$ in the function relation (6) is a pre-distortion function, $h_i$ is an index delay, and $k_i$ is a signal delay. $f_i(x)$, $h_i$ and $k_i$ may be all configured by means of a detection parameter according to a forming parameter of a reference signal, and may be configured by means of a CPU as shown in FIG. 2 and FIG. 3 specifically.

From the function relation (6), it can be seen that the DPD processing mainly includes a multiplication operation and an addition operation. The processing procedure does not influence the periodicity of data. Therefore, if excitation data X(n) is a sequence of which the period is M, after the DPD processing, a cycle period of an output signal $Y_{DPD}(n)$ thereof is also M. Therefore, in a successive data stream outputted by the DPD, if any one collected successive detection data is multiple bits successively distributed in reference data, it is considered that detection is passed.

The detection process of the downlink is illustrated with an example as follows.

It is supposed that TSG input excitation data of the downlink is a sequence of which the period is M, and a DUC interpolation filter group performs N-times interpolation filtering. Data output by the DUC interpolation filter group is a sequence of which the period is L=N*M. Then, digital mixing is performed. If the period of an NCO is K (K is a denominator of a simplest fraction $$\frac{f_{LO}}{f_S}),$$

the period of data output by the NCO is P (P is a lowest common multiple of L and K). If CFR adopts an offset pulse CFR algorithm containing a double interpolation filter, double decimation filter, four-point crest search and sliding window crest search and offset pulse forming module, output data is still a sequence of which the period is P after being subjected to CFR processing. After DPD processing, final data output by the downlink is the sequence of which the period is P. Accordingly, it is given that TSG input excitation data is a sequence of which the period is M, and a downlink configuration parameter is given. The overall output of the downlink is determined, and in a successive data stream, if any one collected successive detection data is a subset of reference data, it is considered that detection is passed.

The subset in the embodiment of the present application may be interpreted as that it is supposed that the reference data is 1024 numbers (each number is 32 bit), if detection data only has 512 numbers which exactly are 512 numbers successively distributed in the foregoing 1024 numbers, so it is considered that the detection data is a subset of the reference data.

Apparatus Embodiment

Figure 5:
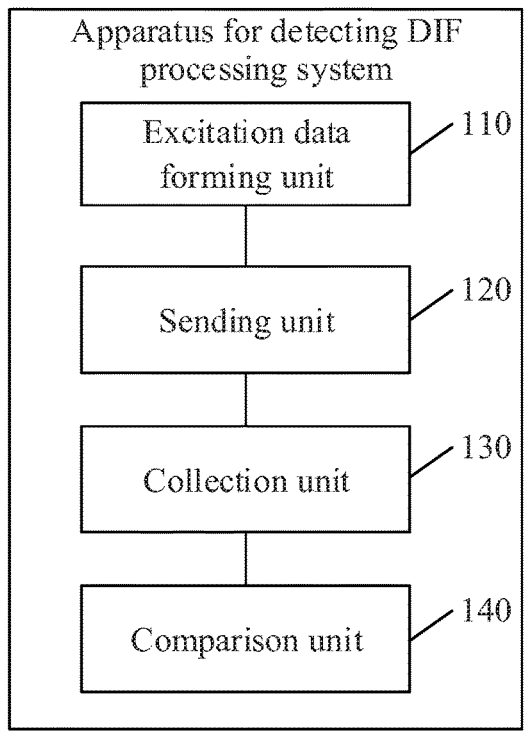
FIG. 5 is a structure diagram of an apparatus for detecting a DIF processing system according to an embodiment of the disclosure.

As shown in FIG. 5, the present embodiment provides an apparatus for detecting a DIF processing system. The apparatus includes an excitation data forming unit 110, a sending unit 120, a collection unit 130, and a comparison unit 140.

The excitation data forming unit 110 is configured to form excitation data.

The sending unit 120 is configured to send the excitation data to the DIF processing system.

The collection unit 130 is configured to collect detection data formed by the DIF processing system processing the excitation data.

The comparison unit 140 is configured to compare the detection data with reference data bit by bit to form a detection result.

The apparatus for detecting the DIF processing system in the present embodiment may be a structure integrated in an RRU. The excitation data forming unit 110 may be a CPU as shown in FIG. 2 or FIG. 3. Certainly, the excitation data forming unit 110 in the present embodiment may also be an information processor having excitation data forming such as an MCU, a DSP or a PLC. The excitation data forming unit may also be a structure such as an ASIC.

A specific structure of the sending unit 120 may include a communication interface. The communication interface may be used to send excitation data formed by the excitation data forming unit 110 to the DIF processing system in the RRU. The sending unit 120 in the present embodiment may be a TSG unit as shown in FIG. 2 or FIG. 3.

The collection unit 130 in the present embodiment may include a collector, which may be used to collect data from an output result of the DIF processing system to form the detection data. The collection unit 130 in the present embodiment may be an MAT unit as shown in FIG. 2 or FIG. 3.

The excitation data in the present embodiment may be data formed randomly, or may be data formed according to a specified generation policy. For example, the excitation data is a periodic sequence sent periodically. The excitation data is a periodic sequence, which may reduce a reference signal, and meanwhile, facilitate the collection unit 130 to collect a detection signal at any time at will.

A specific structure of the comparison unit 140 may be a CPU having an information processing structure. A detection result can be formed by comparing the detection data with the reference data.

The sending unit 120 is configured to send the excitation data to a downlink of the DIF processing system. The detection data includes a downlink detection signal formed by sequentially performing DUC processing, CFR processing and DPD processing on the excitation data via the downlink.

The sending unit 120 is further configured to send the excitation data to an uplink of the DIF processing system.

The detection data includes an uplink detection signal formed by performing DDC processing on the excitation data via the uplink.

The sending unit 120 in the present embodiment can send the excitation data to the downlink and the uplink of the DIF processing system. Certainly, the uplink of the DIF processing system and the downlink of the DIF processing system are connected, and the excitation data can be sent to the uplink and the downlink.

The apparatus may further include a configuration unit, configured to configure a detection parameter. Herein, the detection parameter includes an algorithm parameter, the algorithm parameter being consistent with an algorithm parameter forming the reference data.

Herein, the detection parameter is a configuration parameter for the DIF processing system to process the excitation data.

The configuration unit in the present embodiment may correspond to a processor or processing structure having an information processing function in the RRU. The configuration unit may correspond to the CPU in FIG. 2 or FIG. 3.

During a specific implementation process, the excitation data forming unit 110, the comparison unit 140 and the configuration unit may correspond to different processors or processing circuits respectively, or may integrally correspond to the same processor or processing circuit. In the present embodiment, alternatively, the units correspond to the same processor or processing circuit. Thus, the structure of the apparatus for detecting a DIF processing system can be simplified. The processor or processing circuit adopts a time division multiplexing method to achieve functions of the excitation data forming unit 110, the comparison unit 140 and the configuration unit.

To sum up, the apparatus for detecting a DIF processing system in the present embodiment can be applied to the method for detecting a DIF processing system in the foregoing method embodiment, and can simply and accurately detect the DIF processing system with low cost.

The embodiment of the disclosure also provides a computer storage medium. The computer storage medium stores computer-executable instructions. The computer-executable instructions are used to execute the method for detecting a DIF processing system provided in any one of the foregoing technical solutions, such as the method as shown in FIG. 1 and/or FIG. 4.

The computer storage medium may be various storage media capable of storing program codes such as a mobile storage device, a Read-Only Memory (ROM), a Random Access Memory (RAM), a magnetic disk or an optical disk, and is a non-transitory storage medium alternatively.

In several embodiments provided by the present application, it will be appreciated that the disclosed device and method may be implemented in other manner. For example, the apparatus embodiment described above is merely schematic. For example, division of the units is merely logic function division, and other division manners may be adopted during practical implementation. For example, a plurality of units or components may be combined or integrated into another system, or some characteristics may be neglected or not executed. In addition, coupling or direct coupling or communication connection between the displayed or discussed components may be indirect coupling or communication connection, implemented through some interfaces, of the devices or the units, and may be electrical and mechanical or adopt other forms.

The units described as separate parts may or may not be physically separated, and parts displayed as units may or may not be physical units, namely may be located in the same place or may also be distributed to a plurality of network units. Part or all of the units may be selected to achieve the purpose of the solutions of the present embodiment according to a practical requirement.

In addition, each function unit in each embodiment of the disclosure may be integrated into a processing unit, each unit may also be present independently, and two or more than two units may also be integrated into a unit. The integrated unit may be implemented in a form of hardware, or may be implemented in a form of hardware and software function unit.

Those of ordinary skill in the art may understand that all or some steps implementing the above-mentioned method embodiment may be completed by instructing relevant hardware via a program, the foregoing program may be stored in a computer-readable storage medium, and when the program is executed, the steps in the above-mentioned method embodiment are executed. The foregoing storage medium includes: various media capable of storing program codes such as a mobile storage device, an ROM, an RAM, a magnetic disk or an optical disk.

The above is only the detailed description of the disclosure, but the scope of protection of the disclosure is not limited thereto, and any modifications made according to the principle of the disclosure should be interpreted as falling within the scope of protection of the disclosure.

INDUSTRIAL APPLICABILITY

In the embodiments of the disclosure, detection data outputted by a DIF processing system is directly collected for comparison to obtain a detection result. The accuracy of the detection result can be increased and simple promotion and use in industrial production may be realized.

The invention claimed is:

1. A method for detecting a Digital Intermediate Frequency (DIF) processing system, comprising:
    forming excitation data;
    sending the excitation data to a downlink of the DIF processing system;
    collecting detection data formed by the DIF processing system processing the excitation data; and
    comparing the detection data with reference data bit by bit to form a detection result,
    wherein the detection data comprises: a downlink detection signal formed by sequentially performing Digital Up Converter (DUC) processing, Crest Factor Reduction (CFR) processing and Digital Pre-Distortion (DPD) processing on the excitation data via the downlink.

2. The method according to claim 1, further comprising:
    configuring a detection parameter, wherein the detection parameter comprises an algorithm parameter, the algorithm parameter being consistent with an algorithm parameter forming the reference data,
    wherein the detection parameter is a configuration parameter for the DIF processing system to process the excitation data.

3. The method according to claim 1, wherein the excitation data is a periodic sequence sent periodically.

4. An apparatus for detecting a Digital Intermediate Frequency (DIF) processing system, comprising:
    a memory having stored instructions;
    a processor configured to execute the instructions for implementing a plurality of units comprising:

an excitation data forming unit, configured to form excitation data;

a sending unit, configured to send the excitation data to a downlink of the DIF processing system;

a collection unit, configured to collect detection data formed by the DIF processing system processing the excitation data; and a comparison unit, configured to compare the detection data with reference data bit by bit to form a detection result, wherein the detection data comprises: a downlink detection signal formed by sequentially performing Digital Up Converter (DUC) processing, Crest Factor Reduction (CFR) processing and Digital Pre-Distortion (DPD) processing on the excitation data via the downlink.

5. The apparatus according to claim 4, wherein the processor is further configured to execute the instructions for implementing:

a configuration unit, configured to configure a detection parameter, wherein the detection parameter comprises an algorithm parameter, the algorithm parameter being consistent with an algorithm parameter forming the reference data, wherein the detection parameter is a configuration parameter for the DIF processing system to process the excitation data.

6. The apparatus according to claim 4, wherein the excitation data is a periodic sequence sent periodically.

7. A non-transitory computer storage medium, the non-transitory computer storage medium storing computer-executable instructions, the computer-executable instructions being used to execute a method for detecting a Digital Intermediate Frequency (DIF) processing system, wherein the method comprises:

forming excitation data;

sending the excitation data to a downlink of the DIF processing system;

collecting detection data formed by the DIF processing system processing the excitation data; and comparing the detection data with reference data bit by bit to form a detection result, wherein the detection data comprises: a downlink detection signal formed by sequentially performing Digital Up Converter (DUC) processing, Crest Factor Reduction (CFR) processing and Digital Pre-Distortion (DPD) processing on the excitation data via the downlink.

* * * * *